US009540722B2

(12) United States Patent
Andersson et al.

(10) Patent No.: US 9,540,722 B2
(45) Date of Patent: Jan. 10, 2017

(54) BODY WITH A METAL BASED NITRIDE LAYER AND A METHOD FOR COATING THE BODY

(71) Applicant: SECO TOOLS AB, Fagersta (SE)

(72) Inventors: Jon Andersson, Vasteras (SE); Rickard Forsen, Linkoping (SE); Naureen Ghafoor, Linkoping (SE); Mats Johansson Jöessar, Linkoping (SE); Magnus Oden, Tullinge (SE)

(73) Assignee: SECO TOOLS AB, Fagersta (SE)

( * ) Notice: Subject to any disclaimer, the term of this patent is extended or adjusted under 35 U.S.C. 154(b) by 0 days.

(21) Appl. No.: 14/382,844

(22) PCT Filed: Mar. 6, 2013

(86) PCT No.: PCT/EP2013/054477
§ 371 (c)(1),
(2) Date: Sep. 4, 2014

(87) PCT Pub. No.: WO2013/131943
PCT Pub. Date: Sep. 12, 2013

(65) Prior Publication Data
US 2015/0030406 A1    Jan. 29, 2015

(30) Foreign Application Priority Data

Mar. 7, 2012 (EP) .................... 12158433

(51) Int. Cl.
*B23B 27/14* (2006.01)
*C23C 14/06* (2006.01)
(Continued)

(52) U.S. Cl.
CPC ......... *C23C 14/0641* (2013.01); *B23B 27/148* (2013.01); *B23C 5/20* (2013.01);
(Continued)

(58) Field of Classification Search
USPC .... 51/307, 309; 428/216, 698, 699; 204/192
See application file for complete search history.

(56) References Cited

U.S. PATENT DOCUMENTS

| 6,274,249 B1 * | 8/2001 | Braendle ............. C23C 14/0021 |
|  |  | 204/192.38 |
| 7,704,611 B2 * | 4/2010 | Coddet ................. C23C 14/024 |
|  |  | 428/697 |

(Continued)

FOREIGN PATENT DOCUMENTS

| JP | 2000-326107 | * 11/2000 |
| JP | 2008-031517 | * 2/2008 |

(Continued)

OTHER PUBLICATIONS

Piloud et al "Sturctural changes in Zr—Si—N films vs. their silicon content" Surface & Coatings Techn 180-181 (2004) p. 352-356.*

(Continued)

*Primary Examiner* — Archene Turner
(74) *Attorney, Agent, or Firm* — Corinne R. Gorski

(57) ABSTRACT

A hard and wear resistant coating for a body includes at least one metal based nitride layer having improved high temperature performance. The layer is (Zr1-x-zSixMez)Ny with $0<x<0.30$, $0.90<y<1.20$, $0 \le z<0.25$, and Me is one or more of the elements Y, Ti, Nb, Ta, Cr, Mo, W and Al, comprised of a single cubic phase, a single hexagonal phase or a mixture thereof, with a cubic phase of a sodium chloride structure and a thickness between 0.5 μm and 15 μm. The layer is deposited using cathodic arc evaporation and is useful for metal cutting applications generating high temperatures.

26 Claims, 2 Drawing Sheets

(51) Int. Cl.
  *B23C 5/20* (2006.01)
  *C23C 14/32* (2006.01)
(52) U.S. Cl.
  CPC ........ *C23C 14/325* (2013.01); *B23B 2224/00* (2013.01); *B23C 2224/00* (2013.01); *Y10T 409/303808* (2015.01); *Y10T 428/264* (2015.01)

(56) References Cited

U.S. PATENT DOCUMENTS

| | | | | |
|---|---|---|---|---|
| 8,071,211 | B2* | 12/2011 | Koike | C23C 14/0641 |
| | | | | 428/699 |
| 8,178,220 | B2* | 5/2012 | Okamura | B23B 27/141 |
| | | | | 204/192.1 |
| 8,440,327 | B2* | 5/2013 | Palmqvist | C23C 14/06 |
| | | | | 204/192.1 |

FOREIGN PATENT DOCUMENTS

| | | | |
|---|---|---|---|
| JP | 2008-302474 A | | 12/2008 |
| JP | 2011-020194 | * | 2/2011 |
| WO | 2005100635 A1 | | 10/2005 |

OTHER PUBLICATIONS

Yan et al "Microstructures and Mechanical Properties of Zr—Si—N Films Prepared by Reactive Sputtering" Chines Journal of Vacuum Sci & Tech vol. 26, No. 2 (2006) p. 200-203.*

Liu, et al "Chinese Journal of Vacuum Science and Technology", vol. 26, No. 3, pp. 200-203.

Mei et al. "Effect of Al element on microstructure and mechanical properties of Zr—Si—N composite films", Heat Treatment of Metals, vol. 34, No. 11, pp. 1-4.

Sobol et al "Effect of preparation conditions on the phase composition, structure, and mechanical characteristics of vacuum-arc Zr—Ti—Si—N coatings", The Physica of Metals and Metallography, vol. 112, No. 2, pp. 188-195.

* cited by examiner

BODY WITH A METAL BASED NITRIDE LAYER AND A METHOD FOR COATING THE BODY

RELATED APPLICATION DATA

This application is a §371 National Stage Application of PCT International Application No. PCT/EP2013/054477 filed Mar. 6, 2013 claiming priority of EP Application No. 12158433.8, filed Mar. 7, 2012.

TECHNICAL FIELD

The present invention relates to a hard and wear resistant coating for a body, the coating comprising at least one Zr-based nitride layer. The invention also relates to a method for coating the body and the use thereof.

BACKGROUND OF THE INVENTION

TiN has been widely used as hard layer on cutting tools. However, due to its relatively poor oxidation resistance at elevated temperatures, the focus has shifted towards more complex ternary and quaternary compounds, e.g. Ti—Al—N, Ti—Al—Si—N and Ti—Cr—Al—N with improved high temperature performance. For example, Ti—Al—Si—N has been reported as super hard, H>40 GPa, explained in terms of a two phase structure consisting of crystalline phase of NaCl-type in combination with x-ray amorphous $Si_3N_4$ or $SiN_x$.

EP 0588350 discloses a hard layer of Ti—Si—N composite material deposited on a body using an evaporation technique resulting in layers with a composition of $Ti_aSi_b$ where a is between 75 at % and 85 at % and b is between 15 at % and 25 at %.

JP 2004-338058 discloses a hard coating comprising a compound nitride layer of Ti, Si and Y. The layer has a layered structure composed of gradient layers wherein each layer has a maximum Si content and a minimum Si content. JP 2004-338008 and JP 2004-322279 disclose similar hard coatings comprising a compound (Ti,Si,Cr)N layer and (Ti, Si, Zr)N, respectively.

CN 101338411 discloses Zr—Si—N layers grown by co-sputtering of pure Zr and pure Si targets in a mixed argon and nitrogen discharge on substrates to a total thickness of 2 to 3 µm.

EP 1736565 discloses a cutting tool insert, solid end mill, or drill, comprising a body and a coating composed of one or more layers of refractory compounds of which at least one layer comprises a cubic (Me,Si)X phase, where Me is one or more of the elements Ti, V, Cr, Zr, Nb, Mo, Hf, Ta and Al, and X is one or more of the elements N, C, O or B.

WO2005100635A1 discloses an $Al_xSi_yMe_zN$ coating, $0.001 \leq z \leq 0.08$ where Me is a metal dopant element, for example Zr.

Today industry continuously seeks solutions for economic and high productivity/feed-through manufacturing. To meet these demands there is a need for new materials with advanced properties to improve tool life during operation. Within the metal cutting tool industry, a major part of this effort is focused to improve the wear behavior of the cutting tools by designing the properties of the coating material used in the application. Typically, a high productivity/feed-through cutting process results in a dramatic increase of the tool temperature and hence a coating material with a high temperature wear resistance is essential.

OBJECT OF THE INVENTION

It is an object of the present invention to provide a coating material with improved high temperature performance.
It is further an object of the present invention to provide a method for making the same.

SUMMARY OF THE INVENTION

According to a first aspect of the invention the object is achieved by a hard and wear resistant coating for a body, the coating comprises at least one metal based nitride layer, wherein said layer is $(Zr_{1-x-z}Si_xMe_z)N_y$ with $0<x<0.30$, $0.90<y<1.20$, $0 \leq z<0.25$, and Me is one or more of the elements Y, Ti, Nb, Ta, Cr, Mo, W and Al, the layer comprises a single cubic phase or a single hexagonal phase or a mixture thereof, preferably a cubic phase of a sodium chloride structure, and the layer has a thickness between 0.5 µm and 15 µm. Thereby a hard and wear resistant coating with high temperature wear resistance is achieved. The enhanced temperature properties of the coating are, for example, observed as an improved crater wear resistance in metal machining by chip removal generating high temperature performance.

According to one embodiment of the invention $0<x<0.15$, preferably $0<x<0.085$.

According to one embodiment of the invention $0<z<0.15$, preferably $0<z<0.10$. By the addition of small amounts of one or more of the elements Me: Y, Ti, Nb, Ta, Cr, Mo, W and/or Al excellent high temperature resistance is achieved.

According to one embodiment of the invention Me is one or more of the elements Ta, Ti, Nb, Cr and Al.

According to one embodiment of the invention TC(200)>1.5 and simultaneously TC(111), TC(220) and TC(311) should all be <1.5 where TC(hkl) is determined from the XRD data as follows:

$$TC_{meas}(hkl) = \frac{I_{meas}(hkl)}{I_0(hkl)} \left[ \frac{1}{n} \sum_{n=1}^{n} \frac{I_{meas}(hkl)}{I_0(hkl)} \right]^{-1}$$

where $I_{meas}(hkl)$ is the measured intensity of the (111(1) reflection and $I_0(hkl)$ the standard intensity according to the JCPDS card no. 035-0753, and n=4 is the number of (hkl) reflections used in the calculations.

According to one embodiment of the invention TC(200)>2.0.

According to one embodiment of the invention the at least one metal based nitride layer has a thickness between 0.5 µm and 10 µm.

According to one embodiment of the invention the at least one metal based nitride layer has a nanohardness >20 GPa, preferably the nanohardness is between 25 GPa and 40 GPa.

According to one embodiment of the invention the coating consists of an innermost single layer and/or multilayer comprising, e.g., TiN, TiC, Ti(C,N) or (Ti,Al)N, preferably a single layer of (Ti,Al)N, followed by said (Zr,Si,Me)N layer and an outer single layer and/or multilayer comprising, e.g., TiN, TiC, Ti(C,N) or (Ti,Al)N, preferably a single layer of TiN, to a total coating thickness between 1 µm and 20 µm, preferably between 1 µm and 15 µm, and most preferably between 1 µm and 7 µm.

According to one embodiment of the invention the at least one layer is deposited onto a cutting tool insert for machining by chip removal, said insert comprises a body of a hard alloy of cemented carbide, cermet, ceramics, cubic boron nitride based material or high speed steel. According to a second aspect of the invention the object is achieved by a method for making a hard and wear resistant coating by growing a metal based nitride layer by cathodic arc evaporation with an evaporation current between 50 A and 200 A using composite and/or alloyed cathodes, wherein said layer is $(Zr_{1-x-z}Si_xMe_z)N_y$ with $0<x<0.30$, $0.90<y<1.20$, $0 \leq z<0.25$, where Me is one or more of the elements: Y, Ti, Nb, Ta, Cr, Mo, W or Al, in a reactive atmosphere containing $N_2$ and optionally with a carrier gas such as, e.g. Ar, at a total gas pressure between 1.0 Pa and 7.0 Pa, preferably between 1.5 Pa and 4.0 Pa, with a negative substrate bias between 0 V and 300 V, preferably between 10 V and 150 V, at a temperature between 200° C. and 800° C., preferably between 300° C. and 600° C.

According to a third aspect of the invention the object is achieved by use of a cutting tool insert for machining by chip removal, specifically generating high temperatures, at cutting speeds of 50-400 m/min, preferably 75-300 m/min, with an average feed, per tooth in the case of milling, of 0.08-0.5 mm, preferably 0.1-0.4 mm, depending on cutting speed and insert geometry.

DETAILED DESCRIPTION OF PREFERRED EMBODIMENTS

Figure 1:
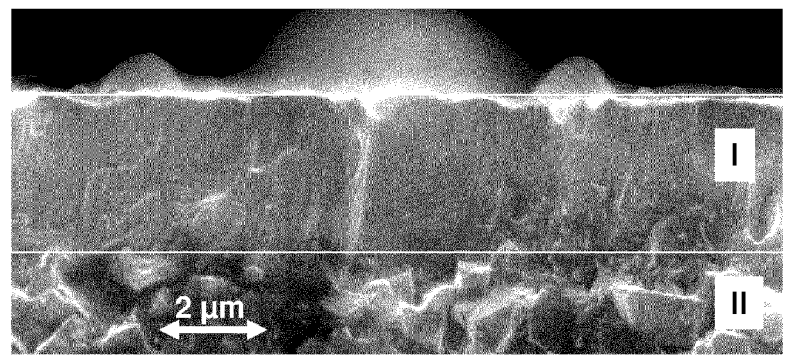
FIG. 1 is a SEM micrograph of a fractured cross section $(Zr_{0.963}Si_{0.037})N_{1.02}$ layer, marked with I, deposited on a cemented carbide insert, marked with II.

According to one embodiment of the present invention, there is provided a body onto which a hard and wear resistant coating is deposited comprising at least one layer of $(Zr_{1-x-z}Si_xMe_z)N_y$ with $0<x<0.30$, preferably $0<x<0.15$, most preferably $0<x<0.085$, $0.90<y<1.20$, preferably $0.90<y<1.10$, $0 \leq z<0.25$, preferably $0 \leq z<0.15$, most preferably $0 \leq z<0.10$, and Me is one or more of the elements Y, Ti, Nb, Ta, Cr, Mo, W and Al, preferably one or more of the elements Ta, Ti, Nb, Cr and Al, most preferably one or more of the elements Ta and Cr, comprising a single cubic phase or a single hexagonal phase or a mixture thereof, preferably with a cubic phase of a sodium chloride structure, as determined by X-ray diffraction with a thickness between 0.5 µm and 15 µm, preferably between 0.5 µm and 10 µm, most preferably between 0.5 µm and 5 µm. Additionally, the layer contains a sum of oxygen (O) and carbon (C) concentration between 0 and 2 at %, preferably between 0 and 1 at %.

The elemental composition of said layer, x, y and z including O and C, is estimated from measurements by, e.g., EDS or WDS techniques and is, within the measurement accuracy, essentially constant all through the layer thickness with a variation less than 10%, including the influence of normal process variations such as, e.g., rotation of the inserts during growth.

Said layer has a strong (200) texture relation, preferably a fibre texture, with (200) lattice planes oriented parallel to the growth surface and characterized by a strong (200) diffraction peak, measured by XRD ($\theta$-$2\eta$ configuration), and low intensity of the (111), (220) and (311) diffraction peaks, respectively. The texture coefficients, TC(hkl), are determined from the XRD data as follows:

$$TC_{meas}(hkl) = \frac{I_{meas}(hkl)}{I_0(hkl)} \left[ \frac{1}{n} \sum_{n=1}^{n} \frac{I_{meas}(hkl)}{I_0(hkl)} \right]^{-1}$$

where $I_{meas}$(hkl) is the measured intensity of the (hkl) reflection and $I_o$(hkl) the standard intensity for the same (hkl) reflection according to literature references. Here are used the standard intensities for cubic ZrN according to the JCPDS card no. 035-0753 where $I_o(111)=100$, $I_o(200)=74$, $I_o(220)=36$ and $I_o(311)=24$, respectively, and n=4, i.e., the number of (hkl) reflections used in the calculations. Only the first order reflections (hkl) are used in the evaluation, i.e., (111), (200), (220) and (311), respectively.

The texture of said layer is defined as TC(200)>1.5, preferably TC(200)>2.0. Simultaneously TC(111), TC(220) and TC(311) should all be <1.5.

Said layer has a columnar microstructure with an average column width of <1 µm, preferably <0.6 µm, as determined by cross sectional transmission electron microscopy of a middle region of the layer, i.e., a region within 30% to 70% of the layer thickness in the growth direction, and said average columnar width is the average of at least 10 adjacent columns Said layer has a compressive stress level of $-6.0$ GPa$<\sigma<-0.5$ GPa, preferably of $-3.0$ GPa$<\sigma<-1.0$ GPa. The residual stress is evaluated by XRD using the $\sin^2 \Psi$-method with a Poisson's ratio of $\upsilon=0.23$ and a Young's modulus of E=379 GPa.

Said layer has a nanohardness >20 GPa, preferably between 25 GPa and 40 GPa, most preferably between 30 GPa and 40 GPa, as measured by nanoindentation experiments.

According to one embodiment of the invention, z=0, and said layer is $(Zr_{1-x}Si_x)N_y$ with $0<x<0.30$, preferably $0<x<0.15$, most preferably $0<x<0.085$, $0.90<y<1.20$, preferably $0.90<y<1.10$, $0 \leq z<0.25$.

It is evident that said (Zr,Si,Me)N layer can be part of a complex coating design and used as an inner, middle and/or an outer layer of said complex coating.

According to one embodiment of the invention, said coating consists of an innermost single layer and/or multilayer comprising, e.g., TiN, TiC, Ti(C,N) or (Ti,Al)N, preferably a single layer of (Ti,Al)N, followed by said (Zr,Si,Me)N layer and an outermost single layer and/or multilayer comprising, e.g., TiN, TiC, Ti(C,N) or (Ti,Al)N, preferably a single layer of TiN, with a total coating thickness between 1 µm and 20 µm, preferably between 1 µm and 15 µm, and most preferably between 1 µm and 7 µm.

According to one embodiment of the invention, said body is a cutting tool insert for machining by chip removal comprising a body of a hard alloy of cemented carbide, cermet, ceramics, cubic boron nitride based material or high speed steel. It is, however, obvious that said body can be other metal cutting tools, e.g., drills and end mills.

The deposition method for said layer is based on PVD techniques, e.g., cathodic arc evaporation or magnetron sputtering using one or more pure, composite and/or alloyed (Zr,Si,Me) cathodes/targets.

In the case of cathodic arc evaporation, the metal based nitride layer is grown with an evaporation current between 50 A and 200 A depending on the cathode size, and said layer is $(Zr_{1-x-z}Si_xMe_z)N_y$ with $0<x<0.30$, $0.90<y<1.20$, $0≤z<0.25$. A higher evaporation current is needed for larger cathodes in order to achieve comparable deposition conditions. The layers are grown using one or more composite and/or alloyed cathodes. The desired layer composition is obtained by selecting appropriate composition of the (Zr,Si,Me) cathode and gas atmosphere, where Me, when present in the layer, is one or more of the elements: Y, Ti, Nb, Ta, Cr, Mo, W or Al, in a reactive atmosphere containing $N_2$ and optionally with a carrier gas such as, e.g. Ar, at a total gas pressure between 1.0 Pa and 7.0 Pa, preferably between 1.5 Pa and 4.0 Pa. The negative substrate bias is between 0 V and 300 V, preferably between 10 V and 150 V, most preferably between 15 V and 60 V. The deposition temperature is between 200° C. and 800° C., preferably between 300° C. and 600° C.

In the case of magnetron sputtering, (Zr,Si,Me)N layers may be grown with a power density applied to the sputter target between 0.5 W/cm$^2$ and 15 W/cm$^2$, preferably between 1 W/cm$^2$ and 5 W/cm$^2$, from co-sputtering of pure elemental targets by altering the power to the respective targets (alter the deposition rate for each target) or from a composite and/or alloyed target, where Me, when present, is one or more of the elements: Y, Ti, Nb, Ta, Cr, Mo, W or Al, in a reactive atmosphere containing $N_2$ and optionally with a carrier gas such as, e.g. Ar, at a total pressure between 0.1 Pa and 5.0 Pa, preferably between 0.1 Pa and 2.5 Pa. The desired layer composition is obtained by selecting appropriate composition of the (Zr,Si,Me) target, target power density and gas atmosphere. The negative substrate bias is between 0 V and 300 V, preferably between 10 V and 150 V, most preferably between 10 V and 80 V. The deposition temperature is between 200° C. and 800° C., preferably between 300° C. and 600° C.

The invention also relates to the use of coated cutting tool insert according to the above for machining at cutting speeds of 50-400 m/min, preferably 75-300 m/min, with an average feed, per tooth in the case of milling, of 0.08-0.5 mm, preferably 0.1-0.4 mm, depending on cutting speed and insert geometry.

EXAMPLE 1

Cemented carbide inserts with composition 94 wt % WC-6 wt % Co were used as a body for the layer depositions by cathodic arc evaporation.

Before deposition, the inserts were cleaned in ultrasonic baths of an alkali solution and alcohol. The system was evacuated to a pressure of less than $2.0×10^{-3}$ Pa, after which the inserts were sputter cleaned with Ar ions. $(Zr_{1-x-z}Si_xMe_z)N_y$ layers, $0.004≤x≤0.234$, $z=0$, coatings 1-8 in Table 1, were grown using $(Zr_{1-a}Si_a)$ cathodes, with a Si content, a, varying between $a=0.01$ and $a=0.25$ (see Table 1). The layers were deposited at 450° C. in a pure $N_2$ atmosphere, a process pressure of 3 Pa, a bias of −30 V and an evaporation current of 60 A to a total thickness of about 3 μm.

TABLE 1

| Coating | Description | $(Zr_{1-a-b}Si_aMe_b)$ Cathode Composition | | $(Zr_{1-x-z}Si_xMe_z)N_y$ Layer Composition | | |
|---|---|---|---|---|---|---|
| | | a | b | x | z | y |
| 1 | ZrSiN | 0.01 | | 0.004 | | 1.00 |
| 2 | ZrSiN | 0.02 | | 0.012 | | 1.01 |
| 3 | ZrSiN | 0.03 | | 0.027 | | 1.02 |

TABLE 1-continued

| Coating | Description | $(Zr_{1-a-b}Si_aMe_b)$ Cathode Composition | | $(Zr_{1-x-z}Si_xMe_z)N_y$ Layer Composition | | |
|---|---|---|---|---|---|---|
| | | a | b | x | z | y |
| 4 | ZrSiN | 0.04 | | 0.037 | | 1.02 |
| 5 | ZrSiN | 0.05 | | 0.041 | | 1.02 |
| 6 | ZrSiN | 0.10 | | 0.093 | | 1.06 |
| 7 | ZrSiN | 0.15 | | 0.138 | | 1.08 |
| 8 | ZrSiN | 0.25 | | 0.234 | | 1.09 |
| 9 | ZrSiTaN | 0.04 | 0.04 | 0.039 | 0.035 | 1.00 |
| 10 | ZrSiTiN | 0.04 | 0.04 | 0.026 | 0.042 | 1.00 |
| 11 | ZrSiTiN | 0.07 | 0.14 | 0.062 | 0.131 | 1.04 |
| 12 | ZrSiNbN | 0.10 | 0.10 | 0.086 | 0.090 | 1.06 |
| 13 | ZrSiCrN | 0.05 | 0.05 | 0.045 | 0.033 | 1.01 |
| 14 | ZrSiCrN | 0.10 | 0.05 | 0.084 | 0.054 | 1.03 |
| 15 | ZrSiCrN | 0.05 | 0.15 | 0.043 | 0.145 | 1.00 |

EXAMPLE 2

Example 1 was repeated using $(Zr_{1-a-b}Si_aMe_b)$ cathodes for the deposition of the $(Zr_{1-x-z}Si_xMe_z)N_y$ layers, coatings 9-15 in Table 1.

EXAMPLE 3

MgO(001) and $Al_2O_3$(0001) single crystals substrates were used as a body for the layer depositions by magnetron sputtering.

Before deposition, the inserts were cleaned in ultrasonic baths of an alkali solution and alcohol. The system was evacuated to a pressure of less than $2.0×10^{-3}$ Pa, after which said substrates were heat treated (de-gassed) at 900° C. for 15 min. $(Zr_{1-x}Si_x)N_y$ layers, $0≤x≤1.00$, $1.00≤y≤1.10$ were grown by co-sputtering of pure Zr and Si targets, 77 mm in diameter in a lab scale deposition system. Layers were deposited at floating bias conditions, temperatures between 500° C. and 900° C. in mixed Ar+$N_2$ discharge with fixed Ar and $N_2$ partial pressures of 0.5 Pa and 0.07 Pa, respectively, to a total layer thickness between 1 μm and 1.5 μm. The different composition, x, were obtained by altering the power to the respective magnetron sources, and hence the deposition rate of Zr and Si, keeping the total power constant at 250 W.

At optimum growth conditions of 800° C. and x=0.20, said layer is highly (200) textured consisting of ZrN-rich/$Si_3N_4$-rich lamellas, 2-5 nm in width with a nanohardness of about 35 GPa. At lower growth temperatures, a polycrystalline microstructure forms with nanohardness close to that measured at the optimum growth conditions and thus offers the possibility for scale-up depositions of $(Zr_{1-x}Si_x)N_y$ layers onto a body of, e.g., cemented carbide inserts.

EXAMPLE 4

The composition x, z and y, of the $(Zr_{1-x-z}Si_xMe_z)N_y$ layers was estimated by energy dispersive spectroscopy (EDS) analysis using a LEO Ultra 55 scanning electron microscope operated at 10 kV and equipped with a Thermo Noran EDS detector. The data were evaluated using the Noran System Six (NSS ver 2) software.

FIG. 1 shows an SEM micrograph of a fractured cross section $(Zr_{0.963}Si_{0.037})N_{1.02}$ layer, marked with I, deposited on a cemented carbide insert, marked with II using a LEO Ultra 55 scanning electron microscope operated at 3 kV.

Figure 2:
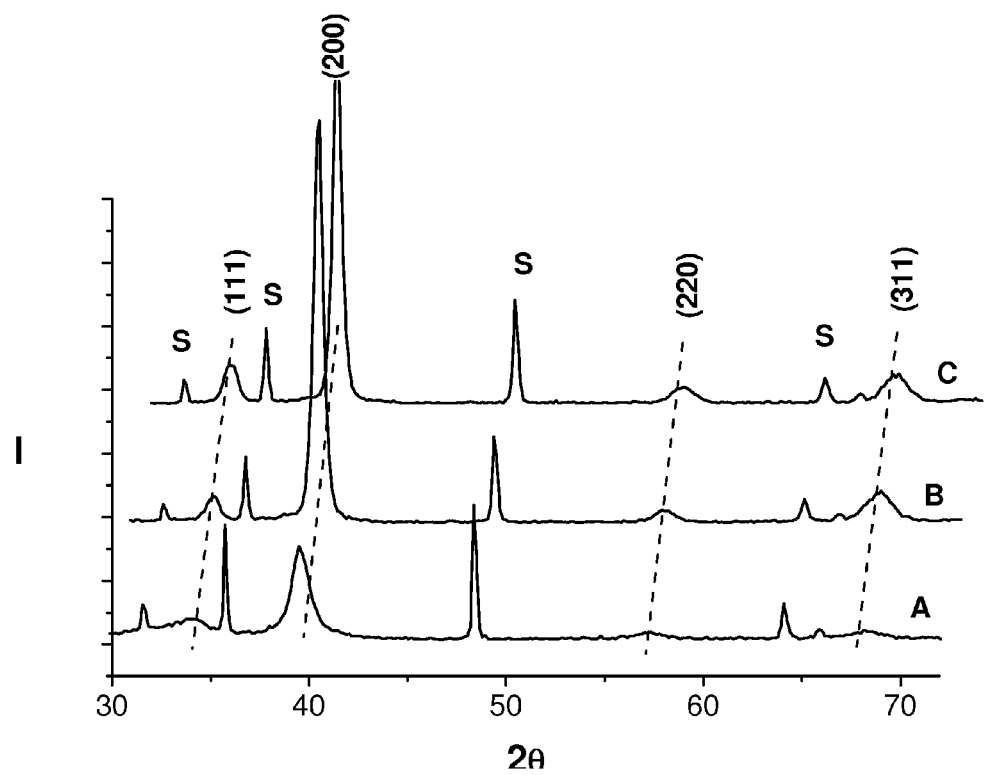
FIG. 2 is a X-ray diffraction pattern from $(Zr_{1-x}Si_x)N$ layers with (A) x=0.012, (B) x=0.037 and (C) x=0.138. S denotes the diffraction peaks for cemented carbide.

X-ray diffraction (XRD) patterns of the as-deposited $(Zr_{1-x-z}Si_xMe_z)N_y$ layers were obtained using Cu K alpha radiation and a θ-2θ configuration in a Bruker AXS D8 Advance diffractometer. FIG. 2 shows X-ray diffraction patterns from $(Zr_{100-x}Si_x)N$ layers with (A) x=0.012, (B) x=0.037 and (C) x=0.138. S denotes the diffraction peaks for cemented carbide. All layers were indexed with a NaCl structure.

The residual stresses, σ, of the $(Zr_{1-x-z}Si_xMe_z)N_y$ layers were evaluated by XRD measurements using the $\sin^2 \Psi$ method (see e.g. I. C. Noyan, J. B. Cohen, Residual Stress Measurement by Diffraction and Interpretation, Springer-Verlag, New York, 1987). The measurements were performed using CuKα-radiation on the (311)-reflection. The residual stress values were within −5.0 GPa<σ<−1.0 GPa for the different layers as evaluated using a Poisson's ratio of υ=0.23 and Young's modulus of E=379 GPa.

Figure 3:
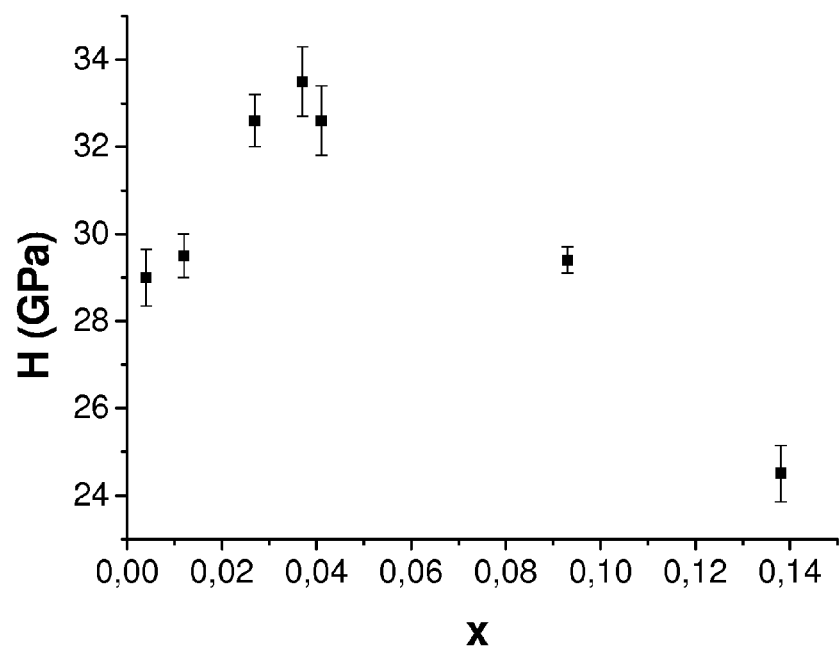
FIG. 3 is a diagram of the nanohardness (H) of $(Zr_{1-x}Si_x)N$ layers as a function of Si content (x).

Hardness data were estimated by the nanoindentation technique of the layers after mechanical polishing of the surface using a UMIS 2000 nanoindentation system with a Berkovich diamond tip with a maximum tip load of 25 mN. FIG. 3 shows the hardness (H) of $(Zr_{1-x}Si_x)N$ layers as a function of the Si content (x) as obtained at room temperature. Optimum hardness is obtained for the $(Zr_{1-x}Si_x)N$ layer with x=0.037 corresponding to layer with best performance during metal machining.

Figure 4:
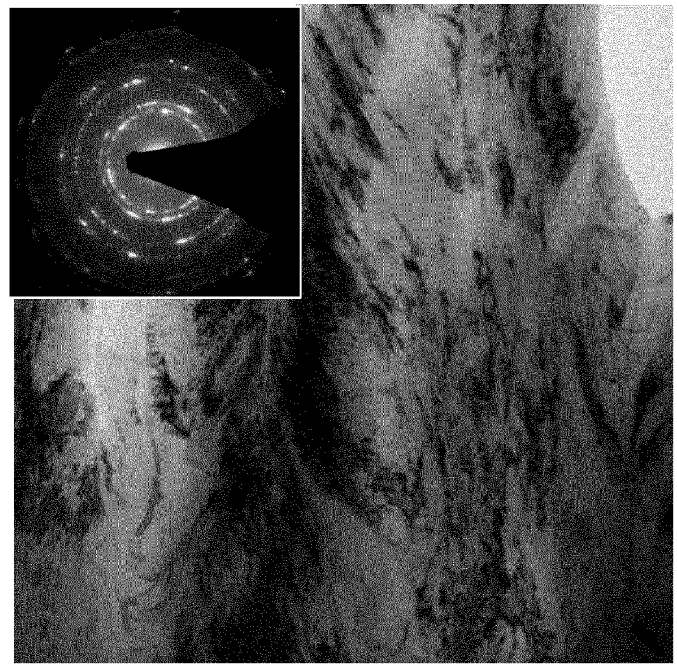
FIG. 4 is a cross-sectional transmission electron micrograph from a middle part of a $(Zr_{0.963}Si_{0.037})N_{1.02}$ layer. The layer has a cubic structure as evident from the electron diffraction pattern (inserted).

The microstructure of $(Zr_{1-x-z}Si_xMe_z)N_y$ layers was studied in cross-section by analytical (scanning) transmission electron microscopy ((S)TEM) using a FEI Technai G2 instrument operated at 200 kV. Samples for TEM were made by conventional mechanical polishing and ion milling until electron translucency. FIG. 4 shows a cross-sectional transmission electron micrograph from a middle part of a $(Zr_{0.963}Si_{0.037})N_{1.02}$ layer according to the invention. The layer had a columnar structure with cubic structure as evident from the electron diffraction pattern (inserted). The average column width, as determined from this and similar images, varied between 0.4 μm and 1 μm as determined from an area close to the middle region of the layer, i.e., a region within 30 to 70% of the layer thickness in the growth direction, taking the average of at least 10 adjacent columns

EXAMPLE 5

The coatings from Table 1 (example 1) were tested in a turning operation with the following data:
Geometry: CNMG120408-MF4
Application: Facing
Work piece material: 100Cr6
Cutting speed: 200 m/min
Feed: 0.25 mm/rev.
Depth of cut: 2 mm
Performance criterion: Crater wear resistance The cutting results are presented in Table 2 clearly indicating an improved crater wear performance of coating 4 of the invention compared to the reference materials according to prior art.

TABLE 2

| Coating | Relative performance |
|---|---|
| Coatings according to embodiments of the invention | |
| Coating 2 | 100 |
| Coating 3 | 110 |
| Coating 4 | 120 |
| Coating 6 | 110 |

TABLE 2-continued

| Coating | Relative performance |
|---|---|
| Reference coatings according prior art | |
| $Ti_{0.34}Al_{0.66}N$ (ref) | 80 |
| $Ti_{0.93}Si_{0.07}N$ (ref) | 100 |
| TiN (ref) | 90 |

The invention claimed is:

1. A hard and wear resistant coating for a body, the coating comprising:
at least one metal based nitride layer deposited on the body by cathodic arc evaporation, wherein said at least one metal based nitride layer is $(Zr_{1-x-z}Si_xMe_z)N_y$ with 0<x<0.15, 0.90<y<1.10, 0≤z<0.25, and Me is one or more of the elements Y, Ti, Nb, Ta, Cr, Mo and W, the at least one metal based nitride layer being selected from the group of a cubic phase of a sodium chloride structure, a single cubic phase, a single hexagonal phase, and a mixture thereof, the at least one metal based nitride layer having a thickness between 0.5 μm and 15 μm, and TC(200)>1.5 and simultaneously TC(111), TC(220) and TC(311) all being <1.5 wherein TC(hkl) is determined from XRD data as follows:

$$TC_{meas}(hkl) = \frac{I_{meas}(hkl)}{I_0(hkl)}\left[\frac{1}{n}\sum_{n=1}^{n}\frac{I_{meas}(hkl)}{I_0(hkl)}\right]^{-1}$$

wherein
$I_{meas}$(hkl) is a measured intensity of the (hkl) reflection and $I_o$(hkl) a standard intensity according to JCPDS card no. 035-0753, and n=4 is the number of (hkl) reflections used in the calculations.

2. The hard and wear resistant coating according to claim 1, wherein 0<x<0.15.

3. The hard and wear resistant coating according to claim 2, wherein 0<x<0.085.

4. The hard and wear resistant coating according to claim 1, wherein 0<z<0.15.

5. The hard and wear resistant coating according to claim 4, wherein 0<z<0.10.

6. The hard and wear resistant coating according to claim 1, wherein Me is one or more of the elements Ta, Ti, Nb, and Cr.

7. The hard and wear resistant coating according to claim 1, wherein TC(200)>2.0.

8. The hard and wear resistant coating according to claim 1, wherein said at least one metal based nitride layer has a thickness between 0.5 μm and 10 μm.

9. The hard and wear resistant coating according to claim 1, wherein said at least one metal based nitride layer has a nanohardness>20 GPa.

10. The hard and wear resistant coating according to claim 9, wherein said at least one metal based nitride layer has a nanohardness between 25 GPa and 40 GPa.

11. The hard and wear resistant coating according to claim 1, wherein said coating comprises at least one innermost layer selected from the group of TiN, TiC, Ti(C,N) or (Ti,Al)N, followed by said (Zr,Si,Me)N layer and at least one outer layer selected from the group of TiN, TiC, Ti(C,N) or (Ti,Al)N, the coating having a total coating thickness between 1 μm and 20 μm.

12. The hard and wear resistant coating according to claim 11, wherein the at least one innermost layer is a single layer of (Ti,Al)N.

13. The hard and wear resistant coating according to claim 11, wherein the at least one innermost layer is a plurality of layers selected from the group of TiN, TiC, Ti(C,N) or (Ti,Al)N.

14. The hard and wear resistant coating according to claim 11, wherein the at least one outer layer is a single layer of TiN.

15. The hard and wear resistant coating according to claim 11, wherein the at least one outer layer is a plurality of layers selected from the group of TiN, TiC, Ti(C,N) or (Ti,Al)N.

16. The hard and wear resistant coating according to claim 11, wherein the total coating thickness is between 1 μm and 15 μm.

17. The hard and wear resistant coating according to claim 11, wherein the total coating thickness is between 1 μm and 7 μm.

18. The hard and wear resistant coating according to claim 1, wherein said at least one metal based nitride layer is deposited onto a cutting tool insert for machining by chip removal, said insert comprising a body of a hard alloy selected from the group of cemented carbide, cermet, ceramics, cubic boron nitride based material or high speed steel.

19. A method of using a cutting tool insert for machining by chip removal, comprising the steps of:
providing a cutting tool insert, the insert including a body of a hard alloy selected from the group of cemented carbide, cermet, ceramics, cubic boron nitride based material or high speed steel and depositing at least one metal based nitride layer onto the cutting tool insert by cathodic arc evaporation, wherein said at least one metal based nitride layer is $(Zr_{1-x-z}Si_xMe_z)N_y$ with $0<x<0.15$, $0.90<y<1.10$, $0\leq z<0.25$, and Me is one or more of the elements Y, Ti, Nb, Ta, Cr, Mo and W, the at least one metal based nitride layer being selected from the group of a cubic phase of a sodium chloride structure, a single cubic phase, a single hexagonal phase, and a mixture thereof, the at least one metal based nitride layer having a thickness between 0.5 μm and 15 μm, and TC(200)>1.5 and simultaneously TC(111), TC(220) and TC(311) all being<1.5 wherein TC(hkl) is determined from XRD data as follows:

$$TC_{meas}(hkl) = \frac{I_{meas}(hkl)}{I_0(hkl)}\left[\frac{1}{n}\sum_{n=1}^{n}\frac{I_{meas}(hkl)}{I_0(hkl)}\right]^{-1}$$

wherein
$I_{meas}(hkl)$ is a measured intensity of the (hkl) reflection and $I_o(hkl)$ a standard intensity according to JCPDS card no. 035-0753, and n=4 is the number of (hkl) reflections used in the calculations; and
specifically generating high temperatures, at cutting speeds of 50-400 m/min, with an average feed, per tooth in the case of milling, of 0.08-0.5 mm, depending on cutting speed and insert geometry.

20. The method of claim 19, wherein the reactive atmosphere includes a carrier gas of Ar.

21. The method of claim 19, wherein the total gas pressure is between 1.5 Pa and 4.0 Pa.

22. The method of claim 19, wherein the negative substrate bias is between 10 V and 150 V.

23. The method of claim 19, wherein the temperature is between 300° C. and 600° C.

24. The method of claim 19, wherein the cutting speed is 75-300m/min.

25. The method of claim 19, wherein average feed, per tooth is 0.1-0.4 mm.

26. A cutting tool insert comprising:
a body; and
a hard and wear resistant coating deposited on the body by cathodic arc evaporation, the coating including at least one metal based nitride layer, wherein said at least one metal based nitride layer is $(Zr_{1-x-z}Si_xMe_z)N_y$ with $0<x<0.15$, $0.90<y<1.10$, $0\leq z<0.25$, and Me is one or more of the elements Y, Ti, Nb, Ta, Cr, Mo and W, the at least one metal based nitride layer being selected from the group of a cubic phase of a sodium chloride structure, a single cubic phase, a single hexagonal phase, and a mixture thereof, the at least one metal based nitride layer having a thickness between 0.5 μm and 15 μm, and TC(200)>1.5 and simultaneously TC(111), TC(220) and TC(311) all being<1.5 wherein TC(hkl) is determined from XRD data as follows:

$$TC_{meas}(hkl) = \frac{I_{meas}(hkl)}{I_0(hkl)}\left[\frac{1}{n}\sum_{n=1}^{n}\frac{I_{meas}(hkl)}{I_0(hkl)}\right]^{-1}$$

wherein
$I_{meas}(hkl)$ is a measured intensity of the (hkl) reflection and $I_o(hkl)$ a standard intensity according to JCPDS card no. 035-0753, and n=4 is the number of (hkl) reflections used in the calculations.

* * * * *